United States Patent
Ollmann, Jr. et al.

(10) Patent No.: US 10,216,089 B2
(45) Date of Patent: *Feb. 26, 2019

(54) METHODS OF FORMING FLEXOGRAPHIC PRINTING MEMBERS

(71) Applicant: Eastman Kodak Company, Rochester, NY (US)

(72) Inventors: Richard R. Ollmann, Jr., Woodbury, MN (US); Elsie Anderson Fohrenkamm, St. Paul, MN (US); Fredrick Charles Mellema, Oakdale, MN (US)

(73) Assignee: EASTMAN KODAK COMPANY, Rochester, NY (US)

( * ) Notice: Subject to any disclaimer, the term of this patent is extended or adjusted under 35 U.S.C. 154(b) by 92 days.

This patent is subject to a terminal disclaimer.

(21) Appl. No.: 15/352,666

(22) Filed: Nov. 16, 2016

(65) Prior Publication Data

US 2018/0136562 A1   May 17, 2018

(51) Int. Cl.
 | | |
 |---|---|
 | *B41N 1/06* | (2006.01) |
 | *G03F 7/32* | (2006.01) |
 | *G03F 7/20* | (2006.01) |

(52) U.S. Cl.
CPC . *G03F 7/32* (2013.01); *G03F 7/20* (2013.01)

(58) Field of Classification Search
CPC ........................................................ G03F 7/00
See application file for complete search history.

(56) References Cited

U.S. PATENT DOCUMENTS

| | | | |
|---|---|---|---|
| 5,115,011 A | 10/1992 | Zertani et al. | |
| 5,115,012 A | 10/1992 | Joerg et al. | |
| 8,257,913 B2 | 9/2012 | Adachi et al. | |
| 8,530,117 B2 | 9/2013 | Ali et al. | |
| 8,632,961 B2 | 1/2014 | Fohrenkamm et al. | |
| 8,771,925 B2 | 7/2014 | Fohrenkamm et al. | |
| 8,945,813 B2 | 2/2015 | Kidnic | |
| 9,005,884 B2 | 4/2015 | Yawata et al. | |
| 2003/0022104 A1 | 1/2003 | Takano et al. | |
| 2007/0117039 A1 | 5/2007 | Wada et al. | |
| 2012/0288682 A1 | 11/2012 | Inque et al. | |
| 2013/0288185 A1* | 10/2013 | Yawata ................. | G03F 7/322 |
| | | | 430/436 |
| 2015/0299624 A1 | 10/2015 | Himmrich et al. | |

\* cited by examiner

*Primary Examiner* — Chanceity N Robinson
(74) *Attorney, Agent, or Firm* — J. Lanny Tucker

(57) ABSTRACT

Flexographic printing members are prepared by developing an exposed flexographic printing member precursor with an aqueous flexographic developer. The aqueous flexographic developer comprises: a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of 0.25-2.0 weight %, and at least 85 weight % of the fatty acid composition is composed of one or more $C_{18}$ mono- or poly-unsaturated fatty acids or alkali metal salts thereof; b) an aminopolycarboxylic acid or alkali metal salt thereof in an amount of 0.05-0.30 weight %; c) a buffer compound in an amount of 05-0.60 weight %; and d) water. Such aqueous flexographic developers can also be provided in concentrated form and appropriately diluted before or during use.

18 Claims, 1 Drawing Sheet

● Comparative Example 1
◇ Invention Example 4

METHODS OF FORMING FLEXOGRAPHIC PRINTING MEMBERS

RELATED APPLICATIONS

Reference is made to the following commonly assigned and copending patent applications, the disclosures of which are incorporated herein by reference:

This application is related to U.S. Ser. No. 15/352,663, (filed on Nov. 16, 2016;

U.S. Ser. No. 15/196,122 filed Jun. 29, 2016; and
U.S. Ser. No. 15/196,132 filed Jun. 29, 2016.

FIELD OF THE INVENTION

This invention relates to a method for providing a relief image in a flexographic printing member that has been imaged and developed using a unique aqueous flexographic developer. This processing solution can be provided as a solid concentrate or a liquid concentrate and dissolved or diluted on-line to process many imaged flexographic printing precursors in a continuous manner. The flexographic developer concentrates comprise one or more saturated or unsaturated fatty acids or alkali metal salts thereof, at least one unsaturated $C_{18}$ fatty acid (or alkali metal salt thereof) being predominant in concentration, an aminopolycarboxylic acid or salt thereof, and a buffering compound.

BACKGROUND OF THE INVENTION

The production of relief images for flexographic printing is generally carried out by imagewise exposing the photosensitive layer of a flexographic printing precursor using suitable imaging radiation such as UV radiation. Unexposed areas of the photosensitive layer are washed off (developed or "washed out") using a suitable developer or processing solution while exposed, and crosslinked areas are left intact. Residual developer is generally removed by evaporation and if necessary, the developed surface is treated to remove tackiness. A resulting flexographic printing plate having a relief image can be wrapped around a cylinder on a printing press and used to transfer ink to a suitable substrate composed of various papers, polymeric films, fabrics, ceramics, and other materials. Alternatively, the resulting flexographic printing member can be a flexographic printing sleeve that is slid onto a suitable mandrel and used to similarly transfer ink to a substrate.

While the non-exposed photopolymer may be soluble in a variety of organic solutions, only some of those organic-based developers do not damage or swell the crosslinked portions while cleanly removing the non-crosslinked portions. Swelling will eventually cause the relief image to deteriorate in the processing bath and the processing solution will have to be changed frequently due to the build-up of sludge. A wide variety of organic solvents and mixtures of solvents have been provided in the art and industry for this purpose.

However, for a variety of environmental and safety concerns, there has been a strong incentive in the industry to avoid the use of solvent-based developers and to find aqueous-based flexographic developers that will provide the same quality of processing as organic solvent-based developers while avoiding environmental concerns associated therewith. This has been difficult to achieve because of the nature of various photopolymer compositions designed for flexographic printing precursors. Not just any type of aqueous solution, with or without water-miscible organic solvents will meet all of the rigorous processing and performance requirements.

For example, it is necessary that effective processing of an imagewise exposed flexographic printing precursor remove all of the non-exposed photopolymer, leaving relief images with well-defined boundaries (high resolution) and appropriate relief depth. Not just any developer, aqueous or non-aqueous, can be effective with a given photopolymer composition.

Moreover, as an aqueous flexographic developer is used continuously to process numerous imagewise exposed precursors, the pH of the developer can change thereby causing more photopolymer components dispersed therein to come out of solution and to re-deposit on the surface of the relief image. This reduces relief image resolution and results in serious image defects during printing. Such dispersed photopolymer components also can stick to brushes used during processing and cause "scum" on the relief image member. This problem increases as the developer pH becomes more acidic.

U.S. Patent Application Publications 2007/0117039 (Wada et al) and 2012/0288682 (Inoue et al.) describe aqueous developers used for solubilizing non-exposed photopolymer compositions, which aqueous developers include one or more nonionic or anionic surfactants and a suitable pH controlling agent.

U.S. Pat. No. 9,005,884 (Yawata et al.) proposes to solve such problems with an aqueous flexographic developer that comprises both saturated and unsaturated fatty acids at a 20:80 to 80:20 weight ratio, along with an alkali agent. Depending upon the particular ratio of saturated and unsaturated fatty acids, such compositions (also known as "soaps") may not sufficiently "develop" the exposed flexographic printing precursors, thereby leaving debris on the resulting flexographic printing plate, leading to severe printing defects in the resulting impressions.

In addition, it has been found that as the pH of such aqueous developers becomes more acidic with continuous use, fatty acids incorporated therein are converted from their basic (ionic) form to their acidic form and their solubility in water and ability to form micelles are seriously reduced. When this happens, the debris from the non-exposed photopolymer is less solubilized in the absence of appropriate micelles. Both precipitated (solid) fatty acids and photopolymer debris float throughout the aqueous flexographic developer, collect on brushes used during processing, and end up as scum on the relief image of the printing plate. These are unacceptable results in the industry and it to address these problems that the present invention is directed.

SUMMARY OF THE INVENTION

The present invention provides a method for providing a flexographic printing member, comprising:

developing an imagewise exposed flexographic printing member precursor with an aqueous flexographic developer to provide a relief image in a flexographic printing plate, wherein the aqueous flexographic developer comprises:

a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 0.25 weight % and up to and including 2 weight %, wherein at least 85 weight % of the fatty acid composition is composed of one or more $C_{18}$ mono- or di-unsaturated fatty acids or alkali metal salts thereof;

b) one or more aminopolycarboxylic acids or alkali metal salts thereof in an amount of at least 0.05 weight % and up to and including 0.30 weight %;

c) a buffer compound in an amount of at least 0.05 weight % and up to and including 0.60 weight %; and d) water in an amount of at least 97 weight % and up to and including 99.5 weight %;

all amounts being based on the total weight of the aqueous flexographic developer.

In some embodiments, this method further comprises: replenishing the aqueous flexographic developer with a replenisher developer composition having the same or a greater concentration of one or more of components a) through c).

In addition, the present invention provides a method for providing a flexographic printing member, comprising:

providing a flexographic developer concentrate;

forming an aqueous flexographic developer either by dissolving the flexographic developer concentrate, if in solid form, in water, or by diluting the flexographic developer concentrate, if in liquid form, by mixing 1 part of the aqueous flexographic developer concentrate with at least 2 parts and up to and including 99.8 parts of water; and developing an imagewise exposed flexographic printing member precursor with the aqueous flexographic developer, to provide a relief image in a flexographic printing member, wherein the flexographic developer concentrate comprises:

a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 10 weight % and up to and including 60 weight %;

wherein at least 85 weight % of the fatty acid composition is composed of one or more $C_{18}$ mono- or poly-unsaturated fatty acids or alkali metal salts thereof;

b) one or more aminopolycarboxylic acids or alkali metal salts thereof in an amount of at least 1.5 weight % and up to and including 15 weight %;

c) a buffer compound in an amount of at least 3.5 weight % and up to and including 25 weight %;

all amounts being based on the total weight of the flexographic developer concentrate.

In some embodiments, wherein the flexographic developer concentrate is provided in liquid form, the method further comprises:

d) water in an amount of up to and including 85 weight %, based on the total weight of the flexographic developer concentrate.

This invention also provides a method for providing a flexographic printing member, comprising:

imagewise exposing a flexographic printing member precursor to provide a latent relief image in an imagewise exposed flexographic printing member precursor, providing a flexographic developer concentrate, forming an aqueous flexographic developer either by dissolving the flexographic developer concentrate, if in solid form, in water, or by diluting the flexographic developer concentrate, if in liquid form, by mixing 1 part of the aqueous flexographic developer concentrate with at least 2 parts and up to and including 99.8 parts of water; and developing an imagewise exposed flexographic printing member precursor with the aqueous flexographic developer, to provide a relief image in a flexographic printing member, wherein the flexographic developer concentrate comprises:

a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 10 weight % and up to and including 60 weight %;

wherein at least 85 weight % of the fatty acid composition is composed of one or more $C_{18}$ mono- or poly-unsaturated fatty acids or alkali metal salts thereof;

b) one or more aminopolycarboxylic acids or alkali metal salts thereof in an amount of at least 1.5 weight % and up to and including 15 weight %;

c) a buffer compound in an amount of at least 3.5 weight % and up to and including 25 weight %;

all amounts being based on the total weight of the flexographic developer concentrate.

In some embodiments, wherein the flexographic developer concentrate is provided in liquid form, this method further comprises:

d) water in an amount of up to and including 85 weight %, based on the total weight of the flexographic developer concentrate.

The present invention provides several advantages. It has been found that with the use of the working strength and concentrated flexographic developers according to the present invention, the amount of debris created during developing (processing) exposed flexographic printing precursors is reduced, and thus debris deposited (or "re-deposited") on the resulting flexographic printing members is reduced. This advantage is largely achieved because of the unique buffering in the compositions and because of the presence of an aminopolycarboxylic acid chelating agent such as EDTA or an alkali metal salt thereof (described below), thereby stabilizing the composition pH. With such a reduction in the formation and re-deposition of debris, improved images are reproduced on various substrates.

The working strength aqueous flexographic developers and concentrated forms thereof (solid or liquid) according to the present invention are composed of saturated and unsaturated fatty acids (or alkali metal salts thereof) wherein mono- or poly-unsaturated fatty acids comprise at least 85% of such fatty acids. The aqueous flexographic developers of the present invention are also unique in that they have reduced viscosity at high concentrations and exhibit a viscosity maximum at certain lower concentrations.

While the present invention is not to be limited to or explained by a particular mechanism, it is believed that the formation of a stable emulsion using a unique combination of fatty acids in the processing solution is important to efficient flexographic processing (development) while minimizing the re-deposition of debris onto the processed flexographic printing members.

Another benefit of the present invention is that the working strength aqueous flexographic developers and concentrated forms are more environmentally friendly and less toxic or hazardous than many flexographic developers used in the industry due to water being the predominant solvent medium rather than organic solvents.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described in the discussion of any embodiment.

Definitions

As used herein to define various components of the working strength aqueous flexographic developers, flexographic developer concentrates, and other materials used in the practice of this invention, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term should be interpreted to have a standard dictionary meaning.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges may be useful to achieve substantially the same results as the values within the ranges. In addition, the disclosure of these ranges is intended as a continuous range including every value between the minimum and maximum values as well as the end points of the ranges.

The aqueous flexographic developers according to the present invention are sometimes known as "washout" solutions or "processing solutions." The fatty acid compositions used in the present invention are sometimes known in the art as "soaps" because they consist of one or more fatty acids or various chemical compositions and concentrations. Such fatty acid compositions can be in either liquid, gel, or solid form.

Unless otherwise indicated herein, the terms "concentrate," "concentrated flexographic developer," and "concentrated aqueous flexographic developer" are meant to refer to the same composition or solution.

Unless otherwise indicated herein, the terms "photosensitive relief image precursor," "flexographic printing member precursor," and "precursor" are meant to refer to the same article.

Use of Invention

The compositions according to the present invention are useful for preparing flexographic printing members after the appropriate "precursors" have been appropriately imaged.

In general, flexographic printing members can be formed after imaging a precursor to provide latent images by applying a processing composition according to the present invention. For example, some useful precursors are described in U.S. Pat. No. 8,492,449 (Inoue et al.), the disclosure of which is incorporated herein by reference, as well as other references cited below. Before this processing is carried out, the latent image can be formed in the precursor using any appropriate method known in the art, for example using a mask image as described in U.S. Pat. No. 9,250,527 (Kidnie et al)., the disclosure of which is incorporated herein by reference.

Flexographic Developers (Working Strength and Concentrates)

The flexographic developers according to the present invention can be manufactured, provided for use, and potentially used either in an aqueous "working strength" form with diluted component concentrations, or as flexographic developer concentrates that can be either in solid or liquid form. Practically speaking, however, the concentrates are generally prepared in manufacturing and sold to users that typically dissolve the concentrates in water or dilute the concentrates using suitable dilution rates to provide useful working strength compositions for a typical flexographic printing environment and equipment. While the components making up both working strength and concentrated flexographic developers are generally the same, their amounts, composition pH, composition viscosity, and other composition properties can be the same or different.

In the following discussion, the various components that are common to both working strength and concentrated flexographic developers will be described, followed by specific discussions of the features relating to the working strength aqueous flexographic developers and the flexographic developer concentrates according to the present invention.

Fatty Acid Composition:

An essential component of both the aqueous flexographic developers and the flexographic developer concentrates is a "fatty acid composition" that consists of one or more saturated or unsaturated fatty acids (or alkali metal salts thereof). It is to be understood that within the aqueous flexographic developers described herein (and in the "fatty acid composition"), the fatty acids described below can be present in protonated form or ionic form, or both protonated and ionic forms in varying amounts, depending upon pH.

Each of these saturated or unsaturated fatty acids (or alkali metal salts thereof) independently have 12 to 20 carbon atoms. When multiple saturated or unsaturated fatty acids (or alkali metal salts thereof) are present, they can have the same or different number of carbon atoms. The alkali metal salts of the fatty acids can be sodium, potassium, or lithium salts, or a mixture of such salts. Typically, potassium salts are desirable and can be obtained by mixing potassium ions (such as in the form of potassium hydroxide) with the fatty acids.

It is essential for providing the advantages of the present invention that least 85 weight % and up to and including 100 weight % of the total weight of the fatty acid composition consists of one or more mono- or poly-unsaturated fatty acids (or alkali metal salts thereof). In particular, such unsaturated fatty acids are $C_{12}$ to $C_{20}$ mono- or poly-unsaturated fatty acids (or alkali metal salts thereof). In many embodiments, the one or more mono- or poly-unsaturated fatty acids (or alkali metal salts thereof) are present in an amount of at least 85 weight % and up to and including 95 weight %, or even at least 85 weight % and up to and including 90 weight %, based on the total weight of the fatty acid composition. The poly-unsaturated fatty acids (or alkali metal salts thereof) are generally di- and tri-unsaturated fatty acids and the di-unsaturated fatty acids (or alkali metal salts thereof) are particularly useful.

Representative useful saturated fatty acids (and alkali metal salts thereof) having 12 to 20 carbon atoms include but are not limited to, lauric acid, sodium laurate, potassium laurate, myristic acid, sodium myristate, potassium myristate, palmitic acid, sodium palmitate, potassium palmitate, stearic acid, sodium stearate, and potassium stearate. Mixtures of two or more of these fatty acids (or alkali metal salts thereof) can be used if desired. One or more potassium salts of such saturated fatty acids are particularly useful.

Representative useful unsaturated fatty acids (including mono- and polyunsaturated compounds) and alkali metal salts thereof having 12 to 20 carbon atoms include but are not limited to, palmitoleic acid, sodium palmitoleate, potassium palmitoleate, oleic acid, sodium oleate, potassium oleate, linoleic acid, sodium linoleate, potassium linoleate, linolenic acid, sodium linolenate, potassium linolenate, ricinoleic acid, sodium ricinoleate, potassium ricinoleate, arachidonic acid, sodium arachidonate, and potassium arachidonate. The potassium salts of such mono- and poly-unsaturated fatty acids are particularly useful. In some embodiments, oleic acid, sodium oleate, or potassium oleate, or a mixture thereof, is present as the unsaturated fatty acid, and such unsaturated fatty acids (or alkali metal salts thereof) can comprise at least 85 weight % and up to and including 100 weight % of the total weight of the fatty acid composition. Mixtures of various mono- or poly-unsaturated fatty acids (or alkali metal salts thereof) can also be used.

From the noted examples of useful fatty acids and alkali metal salts thereof, any of the saturated or unsaturated fatty acids useful in this invention can be neutralized with an alkali metal agent such as sodium hydroxide or potassium hydroxide.

As noted above, the fatty acid composition consists predominantly (at least 85 weight %) of one or more mono- or poly-unsaturated fatty acids. Thus, the weight ratio of unsaturated fatty acids to saturated fatty acids (when present) can be from 5.67:1 to about 999:1.

Both saturated and unsaturated fatty acids (or alkali metal salts thereof) useful in the present invention can be obtained from various commercial sources, or prepared using known starting materials and chemical syntheses that would be readily apparent to one skilled in the art.

Aminopolycarboxylic Acids:

A second essential component in the aqueous flexographic developers and flexographic developer concentrates is one or more aminopolycarboxylic acids or salts thereof (such as alkali metal salts). Such compounds comprise one or more amino groups and two or more carboxylic acid groups (or salt groups) in the same molecule. Such compounds are sometimes known in the art as chelating agents and have previously been used in the photographic industry, when complexed with ferric ions, as bleaching agents.

Useful compounds of this type include but are not limited to, ethylenediamine tetraacetic acid (or salts thereof) known in the art as EDTA (or salt thereof), propylenediamine tetraacetic acid (or salts thereof) known in the art as PDTA or other alkylenediamine tetraacetic acids (or salts thereof); diethylenetriamine pentaacetic acid (or salts thereof); o-diamine cyclohexane tetraacetic acid (or salts thereof); ethylene glycol bis(aminoethyl ether) tetraacetic acid (or salts thereof); diaminopropanol tetraacetic acid (or salts thereof); N-(2-hydroxyethyl)ethylenediamine triacetic acid (or salts thereof); nitrilotriacetic acid (or salts thereof) known in the art as NTA; iminodiacetic acid (or salts thereof) known in the art as ITA; ethyliminodipropionic acid (or salts thereof) known in the art as EIDPA, or other alkyliminodipropionic acids (or salts thereof); methyliminodiacetic acid (or salts thereof) known in the art as MIDA, ethyliminodiactic acid (or salts thereof) known in the art as EIDA, or other alkyliminodiacetic acids (or salts thereof); and other compounds that would be readily apparent to one skilled in the art from these representative compounds. The sodium or potassium salts of EDTA are particularly useful.

Mixtures of these various compounds can be used if desired.

Useful aminopolycarboxylic acids (or salts thereof) can be obtained from various commercial sources or prepared using known starting materials and chemical syntheses that would be readily apparent to one skilled in the art.

Buffer Compounds:

A third essential component of the aqueous flexographic developers and flexographic developer concentrates is a buffer compound (or mixture thereof) that helps to maintain the desired pH during storage and use. Useful buffer compounds can be chosen by a skilled worker by consulting literature describing known compounds having buffer capacity and the pH range in which they are effective and matching such compounds to the pH conditions desired for the present invention. For example, representative buffer compounds useful in the present invention include but are not limited to, a carbonate (such as potassium carbonate or sodium carbonate), sodium tetraborate, potassium tetraborate, sodium phosphate, and potassium phosphate. Such materials are readily available from various commercial sources.

Water:

Water is obviously essential to the aqueous flexographic developers and the flexographic developer concentrates provided in liquid form according to this invention and is the predominant solvent used therein. This means that organic solvents (both water-miscible and water-immiscible organic solvents) are generally present only in minor amounts or particularly in an amount of less than 10 weight % of the total aqueous flexographic developer or flexographic developer concentrate weight, and in most embodiments, such organic solvents are present in an amount of 0 weight % and up to and including 5 weight %, based on the total flexographic developer weight (whether in liquid or solid form). Any suitable quality of water can be used, but generally, the water is deionized water or water obtained using distillation or reverse osmosis.

Optional Addenda:

Materials that are optional but that can be included in the aqueous flexographic developers or flexographic developer concentrates for certain purposes include glycol and poly-glycol mono-ether co-solvents, enzymes, fluorescent whitening agents, perfumes, biocide, fungicides, defoaming agents, colorants, bleach, bleach activators, and surfactants.

For example, one or more glycol and poly-glycol mono-ether co-solvents can be present in each type of composition, which compounds generally have a molecular weight of less than 150, are water-soluble, and have at least one hydroxy group. One useful compound of this type is propylene glycol butyl ether that can be obtained as DOWANOL® PnB from Dow Chemical Company. Such glycol and poly-glycol mono-ether co-solvents can be present in an amount of at least 0.05 weight % and up to and including 0.30 weight %, based on the total weight of the aqueous flexographic developer. The amount of the glycol and poly-glycol mono-ether co-solvents in the flexographic developer concentrates (solid or liquid form) can be readily determined based on the dissolution rate or dilution rate of a liquid concentrate to provide the desired working strength aqueous flexographic developers. Typically, the amount of the one or more glycol and poly-glycol mono-ether-co-solvents in the concentrates is at least 1.5 weight % and up to and including 15 weight %, based on the total weight of flexographic developer concentrate. Other useful glycols and poly-glycol mono-ethers include but are not limited to, 2-phenoxyethanol, 1-ethoxy-2-propanol, 2-methoxypropanol, diethyleneglycol monobutyl ether, 2-butoxyethanol, and propylene glycol propyl ether.

Working Strength Aqueous Flexographic Developers:

In general, at working strength, each aqueous flexographic has a pH of at least 9.5 and up to and including 11.5, more likely of at least 9.8 and up to and including 11.2, or most likely of at least 10.1 and up to and including 10.5. It is desirable to keep the pH of such working strength aqueous flexographic developers during use within +0.5 of the original pH (pH when processing is begun). The aqueous flexographic developers according to the present invention generally exhibit improved pH stability upon storage and use.

Since the amounts of the various components (described below) in the working strength aqueous flexographic developers are quite low, the viscosity of the working strength composition does not significantly vary from that of water.

The fatty acid composition described above is generally present in the working strength aqueous flexographic developers in an amount of at least 0.25 weight % and up to and including 2.0 weight %, or of at least 0.5 weight % and equal to or less than 1.25 weight %, based on the total weight of the aqueous flexographic developer.

The one or more aminopolycarboxylic acids (or salts thereof) described above can be present in the working strength aqueous flexographic developer in an amount of at least 0.05 weight % and up to and including 0.30 weight %, or more likely of at least 0.05 and up to and including 0.25 weight %, based on the total weight of the aqueous flexographic developer.

One or more buffer compounds are generally present in the working strength aqueous flexographic developers in suitable amounts to maintain the desired pH. For example, they can be present in an amount of at least 0.05 weight % and up to and including 0.60 weight %, or at least 0.20 weight % and up to and including 0.60 weight %, based on the total weight of the aqueous flexographic developer.

Water is generally present in the working strength aqueous flexographic developers in an amount of at least 97 weight % and up to and including 99.5 weight %, or even at least 97.5 weight % and up to and including 99.0 weight %, based on the total weight of the aqueous flexographic developer.

Flexographic Developer Concentrates:

Each flexographic developer concentrate (in liquid form) can have a pH that is the same as or different from that working strength aqueous flexographic developer that is formed upon dilution. In general, each concentrate can have a pH of at least 9.5 and up to and including 11.5, more likely of at least 9.8 and up to and including 11.2, or most likely of at least 10.3 and up to and including 10.9.

The viscosity of each concentrate can be at least 100 centipoises (0.1 Pascal sec) and up to and including 900 centipoises (0.9 Pascal sec), or more likely at least 300 centipoises (0.3 Pascal sec) and up to and including 600 centipoises (0.6 Pascal sec), all measured using a standard viscometer at 25° C.

The fatty acid composition described above is generally present in the concentrate in an amount of at least 10 weight % and up to and including 60 weight %, or even at least 12 weight % and equal to or less than 25 weight %, based on the total weight of the concentrate.

The one or more aminopolycarboxylic acids (or salts thereof) described above can be present in the concentrate in an amount of at least 1.5 weight % and up to and including 15 weight %, or more likely of at least 1.5 and up to and including 10 weight %, based on the total weight of the flexographic developer concentrate.

One or more buffer compounds are generally present in the flexographic developer concentrate in suitable amounts to maintain the desired pH. For example, they can be present in an amount of at least 3.5 weight % and up to and including 25 weight %, or at least 4 weight % and up to and including 8 weight %, based on the total weight of the flexographic developer concentrate.

The amount of water in the flexographic developer concentrates, if in liquid form, is determined by considering the dilution ratio needed to provide a suitable working strength aqueous flexographic developer as described above, or to provide a suitable replenisher concentration (as described below). In general, the amount of water in the concentrates can be up to and including 85 weight %, or at least 60 weight % and up to and including 80 weight %, based on the total weight of the flexographic developer concentrates in liquid form.

The aqueous flexographic developers according to the present invention can be prepared by any method wherein the three essential components described above and any optional addenda are added to water in any desirable order and the resulting solution or composition is then stirred to provide homogenization. The mixing method can be carried out at any suitable temperature that does not deteriorate the composition or its utility to process exposed flexographic printing member precursors. The essential components and optional addenda can be incorporated in water in suitable amounts to form either a concentrate (in liquid form) or a working strength composition of any desired concentration and viscosity.

Solid form flexographic developer concentrates can be prepared by allowing a fatty acid (or mixture thereof) and an alkali metal base to react in water, evaporating the water, adding the remaining desired components, and pulverizing the resulting dry composition. Thus, water is absent and the solid concentrate can then be dissolved in a suitable amount of water and mixed to provide any of i) a desired aqueous flexographic developer, ii) a liquid form flexographic developer concentrate; iii) a replenisher developer composition, or iv) a replenisher developer concentrate.

Forming Flexographic Printing Members

To provide a flexographic printing member such a flexographic printing plate or flexographic printing sleeve according to the present invention, containing a relief image, a suitable flexographic printing precursor is imagewise exposed (as described below) followed by suitable processing using an aqueous flexographic developer according to the present invention.

Useful flexographic printing member precursors are described in more detail below in reference to the formation of flexographic printing plates but it is to be understood that the flexographic printing sleeves can be similarly prepared.

Some useful photosensitive relief image precursors or flexographic printing member precursors are described in U.S. Pat. No. 8,142,987 (Ali et al.), U.S. Pat. No. 7,226,709 (Kidnie et al.), U.S. Pat. No. 7,348,123 (Mengel et al.), U.S. Pat. No. 8,945,813 (Kidnie), and U.S. Pat. No. 9,005,884 (noted above), and U.S. Patent Application Publications 2007/0117039 (Wada et al.) and 2012/0288682 (Inoue et al), the disclosures of all of which are incorporated herein by reference.

Such useful precursors are generally composed of a photosensitive or photopolymerizable elastomer or photosensitive elastomeric imagable layer composition disposed on a suitable support or substrate. By "photosensitive" or "photopolymerizable" is meant that the elastomeric imagable layer composition is polymerizable or crosslinkable from irradiation by suitable radiation, or both polymerizable and crosslinkable. The photosensitive elastomeric imagable layer composition generally includes a thermoplastic binder, at least one monomer and an initiator (photoinitiator) that is sensitive to suitable radiation such as visible or UV radiation, or both. Various polymeric binders are known in the art as described in the publications noted in the preceding paragraph.

Poly(styrene/isoprene/styrene) and poly(styrene/butadiene/styrene) block copolymers are useful, as well as various synthetic or natural polymers of conjugated hydrocarbons, including polyisoprene, 1,2-polybutadiene, and butadiene/acrylonitrile.

The "monomer" is generally considered a compound that is compatible with the polymeric binder and is capable of addition polymerization in response to irradiation with actinic radiation. There can be a mixture of monomers if desired. They typically have a molecular weight less than 5000 although compounds with higher molecular weight can be used if desired. Useful monomers include but are not limited to, various acrylates, methacrylates, mono- and polyesters of alcohols and polyols such as polyacrylates and polymethacrylates. Photoinitiators can include but are not limited to, compounds that generate free radicals upon exposure to actinic radiation such as quinones, benzophenones, benzoin ethers, aryl ketones, peroxides, biimidazoles, benzyl dimethyl ketal, and others known in the art.

The photosensitive elastomeric imagable layer composition can also include various additives such as colorants, processing aids, antioxidants, and antiozone agents as are known in the art.

Additionally, a protective cover sheet can be placed over the photosensitive elastomeric imagable layer composition, which cover sheet contains a protective polymer. Generally, the protective layer is transparent and has little tackiness before irradiation. It can be washed away or removed using the aqueous flexographic developers described above according to the present invention. Examples of polymers suitable for preparing this cover sheet include but are not limited to, polyamides and cellulose esters such as cellulose acetate butyrate and cellulose acetate propionate (for example, see U.S. Pat. No. 6,030,749 of Takahashi et al., Cols. 4-8 of U.S. Pat. No. 9,005,884, noted above, Cols. 7-8), the disclosures of both of which are incorporated herein by reference. Useful precursors can also contain suitable infrared radiation-sensitive layers as described in the publications incorporated above.

Flexographic printing member precursors useful in the present invention can be imaged by exposure to suitable imaging (also known as "curing") radiation through a suitable mask image to form an imaged flexographic printing member precursor. The curing radiation is blocked by the mask image in non-exposed regions and the exposed regions are hardened or cured. Exposure can be accomplished by floodwise exposure from suitable irradiation sources (visible light or UV radiation), for example having a wavelength of at least 150 nm and up to and including 750 nm, or at a wavelength of from at least 300 and up to and including 450 nm from a suitable irradiation source or UV radiation. The time for exposure will depend upon the nature and thickness of the flexographic printing member precursor and the source of the radiation. For example, useful commercial flexographic printing member precursors such as Eastman Kodak's FLEXCEL brand precursors and DuPont's Cyrel® brand precursors can be imaged on commercial apparatus known in the art. If desired, both frontside and backside exposures can be carried out, or exposure can be carried out on only a single side of the precursor.

An aqueous flexographic developer according to the present invention can be applied to an exposed flexographic printing member precursor in any suitable manner including but not limited to, spraying, brushing, rolling, dipping (immersing), or any combination thereof. This removes uncured or non-polymerized regions of the photosensitive elastomeric imagable layer composition.

This processing is typically carried out using a working strength aqueous flexographic developer according to the present invention that is provided as manufactured, but more likely is provided by dissolving or dilution of a flexographic developer concentrate according to the present invention. An acceptable dilution rate of a concentrate in liquid form is mixing 1 part of the concentrate with at least 2 parts and up to and including 99.8 parts of water, or more likely at least 20 parts and up to and including 99 parts of water.

Development or processing is usually carried out under conventional conditions such as for at least 5 minutes and up to and including 20 minutes and at a temperature of at least 23° C. and up to and including 32° C. The specific development conditions will be dictated by the type of apparatus used and the specific concentration of components in the aqueous flexographic developer.

During processing, evaporation and resulting flexographic printing members can carry away some of the water in the working strength aqueous flexographic developer. As a result, the development strength (activity) of usefulness of various components can be diminished. It can be useful then to "replenish" the working strength aqueous flexographic developer with a replenisher developer composition that has the same or a greater concentration of the one or more of the essential components a) through c) and any optional components as the original working strength aqueous flexographic developer. A skilled worker would be able to formulate a suitable replenisher developer composition for a given apparatus and processing through put.

When a flexographic developer concentrate, in liquid form, is supplied to the processing apparatus and appropriately diluted as described above to form an aqueous flexographic developer, a replenisher developer composition can be supplied to the processing apparatus using known procedures and apparatus features. Alternatively, or in addition to this described replenishment procedure, the flexographic developer concentrate (in liquid form) also can be replenished before the dilution process using a replenisher developer concentrate that can have the same or different concentration of components a) through c) and any optional components, as the "original" flexographic developer concentrate.

Particularly useful processing methods and systems useful in carrying out the present invention are described in U.S. Ser. Nos. 15/196,122 and 15/196,132 (both noted above).

Post-developing processing of the relief image in the flexographic printing member may be desirable under some circumstances. Typical post-development processing includes drying the relief image to remove any excess processing solution and post-curing by exposing the relief image to curing radiation to cause further hardening or crosslinking. The conditions for these processes are well known to those skilled in the art. For example, the relief image may be blotted or wiped dry or dried in a forced air or infrared oven. Drying times and temperatures would be readily apparent to one skilled in the art.

Detackification can be carried out if the flexographic printing member is still tacky after drying. Such treatments, for example, by treatment with bromide or chlorine solutions or exposure to UV or visible radiation, are well known to a skilled artisan.

The resulting relief image may have a depth of from about 2% to about 100% (typically from about 10 to about 80%) of the original thickness of the photosensitive elastomeric imagable layer composition in the flexographic printing member precursor. For example, if the photosensitive elastomeric imagable layer composition is disposed on a non-photosensitive support, up to 100% of it can be removed in part or all of the relief image. The relief image depth can be from about 150 to about 2000 µm.

The flexographic printing members can be used to advantage in the formation of seamless, continuous flexographic printing webs, or they can be formed as flat sheets that can be wrapped around a cylinder form, for example as a flexographic printing plate or a flexographic printing sleeve. Alternatively, the photosensitive elastomeric imagable layer composition can be mounted around a cylindrical form for imaging and development.

The present invention provides at least the following embodiments and combinations thereof, but other combinations of features are considered to be within the present invention as a skilled artisan would appreciate from the teaching of this disclosure:

1. A method for providing a flexographic printing member, comprising:

developing an imagewise exposed flexographic printing member precursor with an aqueous flexographic developer to provide a relief image in a flexographic printing plate, wherein the aqueous flexographic developer comprises:

a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 0.25 weight % and up to and including 2.0 weight %, wherein at least 85 weight % of the fatty acid composition is composed of one or more $C_{18}$ mono- or poly-unsaturated fatty acids or alkali metal salts thereof;

b) one or more aminopolycarboxylic acids or alkali metal salts thereof in an amount of at least 0.05 weight % and up to and including 0.30 weight %;

c) a buffer compound in an amount of at least 0.05 weight % and up to and including 0.60 weight %; and d) water in an amount of at least 97 weight % and up to and including 99.5 weight %;

all amounts being based on the total weight of the aqueous flexographic developer.

2. The method of embodiment 1, wherein the fatty acid composition is present in an amount equal to or less than 1.25 weight % based on the total weight of the aqueous flexographic developer.

3. The method of embodiment 1 or 2, wherein the aqueous flexographic developer comprises ethylenediamine tetracarboxylic acid or an alkali metal salt thereof in an amount of at least 0.05 weight % and up to and including 0.30 weight %, based on the total weight of the aqueous flexographic developer.

4. The method of any of embodiments 1 to 3, wherein the aqueous flexographic developer further comprises at least 0.05 weight % and up to and including 0.30 weight % of a glycol and poly-glycol mono-ether co-solvent having a molecular weight of less than 150, the amount being based on the total weight of the aqueous flexographic developer.

5. The method of any of embodiments 1 to 4, wherein:

a) the fatty acid composition consists essentially of oleic acid or an alkali metal salt thereof in an amount of at least 90 weight % and up to and including 100 weight % of the fatty acid composition, and the fatty acid composition is present in an amount of at least 0.50 weight % and up to and including 1.25 weight %;

b) ethylenediamine tetracarboxylic acid or an alkali metal salt thereof is present as the one or more aminopolycarboxylic acids or alkali metal salts thereof in an amount of at least 0.05 weight % and up to and including 0.25 weight %; and c) a carbonate is present as the buffer compound in an amount of at least 0.20 weight % and up to and including 0.60 weight %;

all amounts being based on the total weight of the aqueous flexographic developer.

6. The method of any of embodiments 1 to 5, wherein further comprising:

replenishing the aqueous flexographic developer with a replenisher developer composition having the same or a greater concentration of one or more of components a) through c).

7. A method for providing a flexographic printing member, comprising:

providing a flexographic developer concentrate;

forming an aqueous flexographic developer either by dissolving the flexographic developer concentrate, if in solid form, in water, or by diluting the flexographic developer concentrate, if in liquid form, by mixing 1 part of the aqueous flexographic developer concentrate with at least 2 parts and up to and including 99.8 parts of water; and developing an imagewise exposed flexographic printing member precursor with the aqueous flexographic developer, to provide a relief image in a flexographic printing member, wherein the flexographic developer concentrate comprises:

a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 10 weight % and up to and including 60 weight %;

wherein at least 85 weight % of the fatty acid composition is composed of one or more $C_{18}$ mono- or poly-unsaturated fatty acids or alkali metal salts thereof;

b) one or more aminopolycarboxylic acids or alkali metal salts thereof in an amount of at least 1.5 weight % and up to and including 15 weight %; and c) a buffer compound in an amount of at least 3.5 weight % and up to and including 25 weight %;

all amounts being based on the total weight of the flexographic developer concentrate.

8. The method of embodiment 7, wherein the flexographic developer concentrate is provided in liquid form, and further comprises:

d) water in an amount of up to and including 85 weight %, based on the total weight of the flexographic developer concentrate.

9. The method of embodiment 7 or 8, wherein the fatty acid composition is present in an amount equal to or less than 25 weight %, based on the total weight of the flexographic developer concentrate.

10. The method of any of embodiments 7 to 9, wherein the flexographic developer concentrate comprises ethylenediamine tetracarboxylic acid or an alkali metal salt thereof in an amount of at least 1.5 weight % and up to and including 10 weight %, based on the total weight of the flexographic developer concentrate.

11. A method for providing a flexographic printing member, comprising:

imagewise exposing a flexographic printing member precursor to provide a latent relief image in an imagewise exposed flexographic printing member precursor, providing a flexographic developer concentrate, forming an aqueous flexographic developer either by dissolving the flexographic developer concentrate, if in solid form, in water, or by diluting the flexographic developer concentrate, if in liquid form, by mixing 1 part of the flexographic developer concentrate with at least 2 parts and up to and including 99.8 parts of water; and developing the imagewise exposed flexographic printing member precursor with the aqueous flexographic developer, to provide a relief image in a flexographic printing member, wherein the flexographic developer concentrate comprises:

a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 10 weight % and up to and including 60 weight %;

wherein at least 85 weight % of the fatty acid composition is composed of one or more $C_{18}$ mono- or poly-unsaturated fatty acids or alkali metal salts thereof;

b) one or more aminopolycarboxylic acids or alkali metal salts thereof in an amount of at least 1.5 weight % and up to and including 15 weight %; and c) a buffer compound in an amount of at least 3.5 weight % and up to and including 25 weight %;

all amounts being based on the total weight of the flexographic developer concentrate.

12. The method of embodiment 11, wherein the flexographic developer concentrate is provided in liquid form, and further comprises:

d) water in an amount of up to and including 85 weight %, based on the total weight of the flexographic developer concentrate.

13. The method of any of embodiments 10 to 12, wherein the flexographic developer concentrate further comprises at least 1.5 weight % and up to and including 15 weight % of a glycol and poly-glycol mono-ether co-solvent having a molecular weight of less than 150, the amount being based on the total weight of the flexographic developer concentrate.

14. The method of any of embodiments 7 to 13, wherein:

a) the fatty acid composition consists essentially of oleic acid or an alkali metal salt thereof in an amount of at least 90 weight % and up to and including 100 weight % of the fatty acid composition, and the fatty acid composition is present in an amount of equal to or less than 25 weight %;

b) ethylenediamine tetracarboxylic acid or an alkali metal salt thereof is present as the one or more aminopolycarboxylic acids or alkali metal salts thereof in an amount of at least 1.5 weight % and up to and including 10 weight %; and c) a carbonate is present as the buffer compound in an amount of at least 4 weight % and up to and including 8 weight %;

all amounts being based on the total weight of the flexographic developer concentrate.

15. The method of any of embodiments 7 to 14, wherein the flexographic developer concentrate is provided in liquid form, and further comprises:

d) water in an amount of at least 60 weight % and up to and including 80 weight %, based on the total weight of the flexographic developer concentrate.

16. The method of any of embodiments 7 to 15, wherein the aqueous flexographic developer concentrate has a viscosity of at least 100 centipoises and up to and including 900 centipoises.

17. The method of any of embodiments 7 to 16, further comprising:

replenishing the flexographic developer concentrate with a replenisher developer concentrate having the same or a greater concentration of one or more of components a) through c).

18. The method of any of embodiments 1 to 17, wherein the aqueous flexographic developer or flexographic developer concentrate has a pH of at least 9.5 and up to and including 11.5.

19. The method of any of embodiments 1 to 18, wherein the fatty acid composition consists essentially of oleic acid or an alkali metal salt thereof in an amount of at least 85 weight % and up to and including 90 weight %, based of the total weight of the fatty acid composition.

20. The method of any of embodiments 1 to 19, wherein the buffer compound is a carbonate.

21. The method of any of embodiments 7 to 14, wherein the flexographic developer concentrate is provided in solid form.

The following Examples are provided to illustrate the practice of this invention and are not meant to be limiting in any manner. Unless otherwise indicated, the materials used in the working examples were obtained from various commercial sources.

Comparative Example 1

A flexographic developer concentrate was prepared outside of the present invention by allowing a fatty acid mixture to react with potassium hydroxide. Glycerin was added and the pH was adjusted to 9.8. Water was added to bring the solids concentration to 21 weight %. The final flexographic developer concentrate had the following components and amounts (weight %):

| | |
|---|---|
| Lauric acid | 4.03% |
| Myristic acid | 1.47% |
| Palmitic acid | 1.31% |
| Steric acid | 0.88% |
| Oleic acid | 8.28% |
| Linoleic acid | 0.58% |
| Potassium hydroxide | 3.72% |
| Glycerin | 0.73% |
| Water | 79.00% |

This flexographic developer concentrate was made into an aqueous flexographic developer (working strength solution) by diluting 1 part of the noted flexographic developer concentrate with 42 parts of water to provide an aqueous flexographic developer having a total amount of saturated and unsaturated fatty acid, fatty acid salts, and glycerin of 0.5 weight %, and a pH of 9.5. The resulting aqueous flexographic developer was placed in an orbital processor unit and used to process exposed flexographic printing plates like those described in U.S. Pat. No. 8,492,449 (noted above), except such precursors contained no anti-adhesive layer over the photopolymer layer, using known conditions and procedures for such flexographic printing member precursors. The amount of debris on the processed flexographic printing plates was evaluated and assigned a numerical value between 1 and 5 with 1 meaning no debris and 5 meaning an unacceptable amount of debris.

Invention Example 1

A flexographic developer concentrate was prepared according to the present invention by allowing a fatty acid mixture to react with potassium hydroxide. The pH was adjusted to 10.6 and water was added to bring the solids concentration to 21 weight %. The final flexographic developer concentrate had the following components and amounts:

| | |
|---|---|
| Palmitic acid | 0.04% |
| Steric acid | 0.46% |
| Oleic acid | 15.77% |
| Linoleic acid | 1.24% |
| Linolenic acid | 0.02% |
| Potassium hydroxide | 3.48% |
| Water | 79.00% |

One part of this concentrate was diluted with 42 parts of water to provide an aqueous flexographic developer having a total fatty acid and fatty acid salt concentration of 0.5 weight % and a pH of 10.5. The resulting aqueous flexographic developer was placed in an orbital processor unit and used to process exposed flexographic printing plates as described above in Comparative Example 1, using known conditions and procedures for such flexographic printing member precursors. The amount of debris on the processed flexographic printing plates was evaluated and assigned a numerical value as described for Comparative Example 1.

Invention Example 2

A flexographic developer concentrate was prepared according to the present invention by allowing a fatty acid mixture to react with potassium hydroxide. Potassium carbonate was added and the pH was adjusted to 10.6. Water was added to bring the solids concentration to 21 weight %. The final flexographic developer concentrate had the following components and amounts:

| | |
|---|---|
| Palmitic acid | 0.03% |
| Steric acid | 0.33% |
| Oleic acid | 11.19% |
| Linoleic acid | 0.88% |
| Linolenic acid | 0.01% |
| Potassium hydroxide | 2.47% |
| Potassium carbonate | 6.09% |
| Water | 79.00% |

One part of the resulting flexographic developer concentrate was diluted with 42 parts of water to provide an aqueous flexographic developer having a total fatty acid and fatty acid salt amount of 0.5 weight % and a pH of 10.5.

This aqueous flexographic developer was placed in an orbital processor unit and used to process exposed flexographic printing plates as described above in Comparative Example 1, using known conditions and procedures for such flexographic printing member precursors. The amount of debris on the processed flexographic printing plates was evaluated and assigned a numerical value as described for Comparative Example 1.

Invention Example 3

A flexographic developer concentrate was prepared according to the present invention by allowing a fatty acid mixture to react with potassium hydroxide. Potassium carbonate and EDTA disodium salt were added and the pH was adjusted to 10.6. Water was added to bring the solids concentration to 21 weight %. The final flexographic developer concentrate had the following components and amounts:

| | |
|---|---|
| Palmitic acid | 0.02% |
| Steric acid | 0.29% |
| Oleic acid | 10.00% |
| Linoleic acid | 0.79% |
| Linolenic acid | 0.01% |
| Potassium hydroxide | 2.21% |
| Potassium carbonate | 5.44% |
| EDTA disodium salt | 2.25% |
| Water | 79.00% |

One part of the resulting flexographic developer concentrate was diluted with 42 parts of water to provide an aqueous flexographic developer having a total fatty acids and fatty acid salts content of 0.5 weight % and a pH of 10.5.

The aqueous flexographic developer was placed in an orbital processor unit and used to process exposed flexographic printing plates as described above in Comparative Example 1, using known conditions and procedures for such flexographic printing member precursors. The amount of debris on the processed flexographic printing plates was evaluated and assigned a numerical value as described for Comparative Example 1.

Invention Example 4

A flexographic developer concentrate was prepared according to the present invention by allowing a fatty acid mixture to react with potassium hydroxide. Potassium carbonate, EDTA disodium salt, and DOWANOL® PnB co-solvent were added. The pH was adjusted to 10.6 and water was added to bring the solids concentration to 21 weight %. The final flexographic developer concentrate had the following make up:

| | |
|---|---|
| Palmitic acid | 0.02% |
| Steric acid | 0.26% |
| Oleic acid | 9.03% |
| Linoleic acid | 0.71% |
| Linolenic acid | 0.01% |
| Potassium hydroxide | 1.99% |
| DOWANOL ® PnB | 2.03% |
| Potassium carbonate | 4.91% |
| EDTA disodium salt | 2.03% |
| Water | 79.00% |

One part of the resulting flexographic developer concentrate was diluted with 199 parts of water to provide an aqueous flexographic developer having a total fatty acid salts content of 0.5 weight % and a pH of 10.5.

The resulting aqueous flexographic developer was placed in an orbital processor unit and used to process exposed flexographic printing plates as described above in Comparative Example 1, using known conditions and procedures for such flexographic printing member precursors. The amount of debris on the processed flexographic printing plates was evaluated and assigned a numerical value as described for Comparative Example 1.

Evaluation of Debris Levels on Processed Flexographic Printings:

The flexographic printing plate precursors described above were exposed in a standard fashion using a FLEXEL mask and lamination system with the same standard back exposures and main exposures. The exposed precursors were processed using an orbital brush processor that is commonly used in the industry. The debris level for each processed flexographic printing plate was evaluated under a light microscope. A higher level of debris was given a higher score as described above, and the higher the amount of debris, the worse the printing results.

The following results were determined for the Examples described above:

| Example | Average Debris Score | | |
| --- | --- | --- | --- |
|  | Plates 1-5 | 5-10 | 10-15 |
| Comparative 1 | 1.6 | 1.7 | 2.2 |
| Invention 1 | 1.2 | 1.5 | 1.8 |
| Invention 2 | 0.9 | 0.9 | 1.0 |
| Invention 3 | 0.75 | 1.0 | 1.0 |
| Invention 4 | 0.80 | 0.95 | 1.0 |

Figure 1:
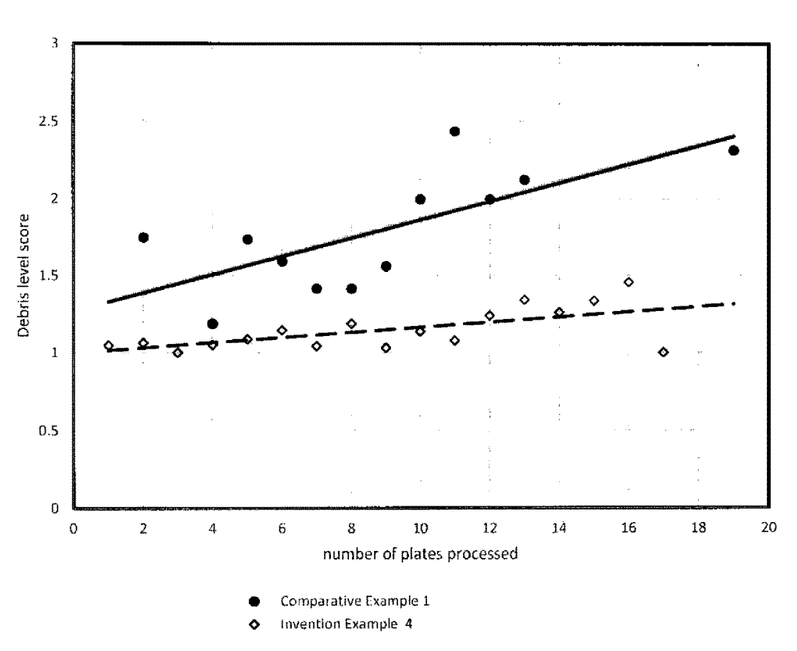
FIG. 1 is a graphical representation of data for debris vs. processed flexographic printing plates obtained from some of the working examples described below.

Comparison of the Debris Levels on Printing Plates Prepared Using Comparative Example 1 and Invention Example 4:

A number of imagewise exposed flexographic printing plate precursors were processed in the processing unit as described above. As the number of flexographic printing plate precursors being processed increased, the amount of debris from the non-exposed material in the aqueous flexographic developer increased, leading to increased debris on the finished flexographic printing plates. FIG. 1 shows the debris level observed vs. the number of flexographic printing plates that were processed using the aqueous flexographic developers of both Comparative Example 1 and Invention Example 4. The observed debris was found on the resulting flexographic printing plates. The solid line data represent the results obtained using Comparative Example 1 and the dashed line data represent the results obtained using Invention Example 4. Both illustrated lines represent an average of the respective data points wherein each datum point represents an individual processed flexographic printing plate.

It is evident that while observed debris increased as the number of processed flexographic printing plates was increased in both compositions (that is, as the aqueous developer composition was "seasoned" from use), the Invention Example 4 aqueous flexographic developer provided a reduction in debris formation as the number of processed flexographic printing plates increased, compared to the aqueous developer composition of Comparative Example 1.

Invention Example 5

A flexographic developer concentrate was prepared according to the present invention containing the following components and had a pH of 10.6. No saturated fatty acids (or alkali metal salts thereof) were included and the fatty acid composition contained only potassium oleate.

Potassium oleate at 54.9 weight %;
Potassium carbonate at 23.1 weight %;
EDTA di sodium salt at 10.0 weight %; and
Propylene glycol n-butyl ether at 11.0 weight %.

Comparative Example 2

A flexographic developer concentrate was prepared outside of the present invention but according to the teaching in U.S. Pat. No. 9,005,884 (noted above) in which the weight ratio of unsaturated fatty acids (or alkali metal salts thereof) to saturated fatty acids (or alkali metal salts thereof) was 80:20. The concentrate components were as follows and the concentrate had a pH of 10.6:

Potassium oleate (mono-unsaturated) at 79.4 weight %;
Potassium Stearate (saturated) at 20.1 weight %; and
Potassium Hydroxide at 0.5 weight %.

Comparative Example 3

Another flexographic developer concentrate was prepared outside of the present invention but according to the teaching in U.S. Pat. No. 9,005,884 (noted above) in which the weight ratio of unsaturated fatty acids (or alkali metal salts thereof) to saturated fatty acids (or alkali metal salts thereof) was 20:80. The concentrate had a pH of 10.7 and its components were as follows:

Potassium Oleate at 20.1 weight %;
Potassium Stearate at 79.4 weight %; and
Potassium Hydroxide at 0.5 weight %.

Each of the concentrates of Invention Example 5 and Comparative Examples 2 and 3 were used to make working strength aqueous flexographic developers by diluting one part of each with 116.6 parts of water to provide 0.85 weight % solids. The resulting working strength aqueous flexographic developers had a pH of 10.4, 10.5, and 10.5, respectively.

Samples of flexographic printing plates as described in Comparative Example 1 were back exposed at each of 30 seconds, 45 seconds, 60 seconds, and 75 seconds using a Mekrom Concept 302 EDLF exposure unit to establish a "plate floor" (Plate 1). A section of each printing plate sample that had been exposed at 75 seconds was given a front exposure ("main exposure") of 8 minutes to provide a fully exposed printing "plate ceiling".

Each exposed flexographic printing plate precursor was then processed (developed) with each of the working strength aqueous flexographic developers of Invention Example 5 and Comparative Examples 2 and 3 in a Takano A-Flexo A2W Plate Processor for 4 minutes at 54° C. By subtracting the thickness of the plate floor from the thickness of the plate ceiling, a flexographic printing plate relief value was obtained for the various back exposures and a back exposure value for a desired relief value was determined.

Using the values determined above for the aqueous flexographic developers of Invention Example 5 and Comparative Examples 2 and 3, flexographic printing plates (precursors) like those described in Comparative Example 1 were back exposed. These flexographic printing plate were then exposed imagewise with a main exposure of various times (Plate 2) and processed as described above using the aqueous flexographic developers of Invention Example 5 and Comparative Examples 2 and 3, respectively. By examining the quality of the features from the main exposure values, an optimal main exposure was determined for each aqueous flexographic developer.

Six additional samples of the noted flexographic printing plates (precursors) (3$^{rd}$ through 8$^{th}$ plates) were processed without exposure using each of the three aqueous flexographic developers to increase the amount of solid material in each processing bath.

Two more samples of the flexographic printing plate described above in Comparative Example 1 ("9$^{th}$ and 10$^{th}$ plates") were each exposed using a test pattern and a main exposure value that encompassed the determined optimum values (as determined using plates 1 and 2 described above, as shown below in TABLE I). The level of debris on each of the 9$^{th}$ and 10$^{th}$ plates was examined and assigned a relative value from 1.0 to 6.0 with 1.0 being good. The initial pH of each aqueous flexographic developer was measured, the respective decreased pH values were measured after processing of the 10$^{th}$ plate, and the absolute pH difference was determined. The results of this experimentation are shown in the following TABLE I.

TABLE I

| Developer Example | Back Exposure Value (seconds) | Main Exposure Value 9$^{th}$ plate (minutes) | Main Exposure | Debris Level 9$^{th}$ plate | Debris Level 10$^{th}$ plate | pH Change |
|---|---|---|---|---|---|---|
| Invention 5 | 57 | 12 | 14 | 0.8 | 1.0 | 0.35 |
| Comparative 2 | 65 | 11 | 12 | 4.9 | 5.4 | 0.75 |
| Comparative 3 | 69 | 11 | 12 | 4.6 | 5.1 | 1.6 |

The results shown in TABLE I indicate that the debris level for plates 9 and 10 and the pH change of the aqueous flexographic developer of Invention Example 5 are much lower than for the aqueous flexographic developers of Comparative Examples 2 and 3.

The invention has been described in detail with particular reference to certain preferred embodiments thereof, but it will be understood that variations and modifications can be effected within the spirit and scope of the invention.

The invention claimed is:

1. A method for providing a flexographic printing member, comprising:
   developing an imagewise exposed flexographic printing member precursor with an aqueous flexographic developer to provide a relief image in a flexographic printing plate,
   wherein the aqueous flexographic developer comprises:
   a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 0.25 weight % and up to and including 2.0 weight %,
   wherein at least 85 weight % of the fatty acid composition is composed of one or more $C_{18}$ mono- or poly-unsaturated fatty acids or alkali metal salts thereof;
   b) one or more aminopolycarboxylic acids or alkali metal salts thereof in an amount of at least 0.05 weight % and up to and including 0.30 weight %;
   c) a buffer compound in an amount of at least 0.05 weight % and up to and including 0.60 weight %; and
   d) water in an amount of at least 97 weight % and up to and including 99.5 weight %;
   all amounts being based on the total weight of the aqueous flexographic developer; and
   replenishing the aqueous flexographic developer with a replenisher developer composition having the same or a greater concentration of one or more of components a) through c).

2. The method of claim 1, wherein the aqueous flexographic developer has a pH of at least 9.5 and up to and including 11.5.

3. The method of claim 1, wherein the fatty acid composition consists essentially of oleic acid or an alkali metal salt thereof in an amount of at least 85 weight % and up to and including 100 weight %, based on the total weight of the fatty acid composition.

4. The method of claim 1, wherein the buffer compound is a carbonate.

5. The method of claim 1, wherein the fatty acid composition is present in an amount equal to or less than 1.25 weight % based on the total weight of the aqueous flexographic developer.

6. The method of claim 1, wherein the aqueous flexographic developer comprises ethylenediamine tetracarboxylic acid or an alkali metal salt thereof in an amount of at least 0.05 weight % and up to and including 0.30 weight %, based on the total weight of the aqueous flexographic developer.

7. The method of claim 1, wherein the aqueous flexographic developer further comprises at least 0.05 weight % and up to and including 0.30 weight % of a glycol and poly-glycol mono-ether co-solvent having a molecular weight of less than 150, the amount being based on the total weight of the aqueous flexographic developer.

8. The method of claim 7, wherein:
   a) the fatty acid composition consists essentially of oleic acid or an alkali metal salt thereof in an amount of at least 90 weight % and up to and including 100 weight % of the fatty acid composition, and the fatty acid composition is present in an amount of at least 0.50 weight % and up to and including 1.25 weight %;
   b) ethylenediamine tetracarboxylic acid or an alkali metal salt thereof is present as the one or more aminopolycarboxylic acids or alkali metal salts thereof in an amount of at least 0.05 weight % and up to and including 0.25 weight %; and
   c) a carbonate is present as the buffer compound in an amount of at least 0.20 weight % and up to and including 0.60 weight %;
   all amounts being based on the total weight of the aqueous flexographic developer.

9. A method for providing a flexographic printing member, comprising:
   providing a flexographic developer concentrate;
   forming an aqueous flexographic developer either by dissolving the flexographic developer concentrate, if in solid form, in water, or by diluting the flexographic developer concentrate, if in liquid form, by mixing 1 part of the aqueous flexographic developer concentrate with at least 2 parts and up to and including 99.8 parts of water; and
   developing an imagewise exposed flexographic printing member precursor with the aqueous flexographic developer, to provide a relief image in a flexographic printing member,
   wherein the flexographic developer concentrate comprises:

a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 10 weight % and up to and including 60 weight %;
wherein at least 85 weight % of the fatty acid composition is composed of one or more $C_{18}$ mono- or poly-unsaturated fatty acids or alkali metal salts thereof;
b) one or more aminopolycarboxylic acids or alkali metal salts thereof in an amount of at least 1.5 weight % and up to and including 15 weight %;
c) a buffer compound in an amount of at least 3.5 weight % and up to and including 25 weight %; and
d) water in an amount of up to and including 85 weight %, based on the total weight of the flexographic developer concentrate,
all amounts being based on the total weight of the flexographic developer concentrate.

10. The method of claim 9, wherein the fatty acid composition consists essentially of oleic acid or an alkali metal salt thereof in an amount of at least 85 weight % and up to and including 100 weight %, based on the total weight of the fatty acid composition.

11. The method of claim 9, wherein the buffer compound is a carbonate.

12. The method of claim 9, wherein the fatty acid composition is present in an amount equal to or less than 25 weight %, based on the total weight of the flexographic developer concentrate.

13. The method of claim 9, wherein the flexographic developer concentrate comprises ethylenediamine tetracarboxylic acid or an alkali metal salt thereof in an amount of at least 1.5 weight % and up to and including 10 weight %, based on the total weight of the flexographic developer concentrate.

14. The method of claim 9, wherein the flexographic developer concentrate further comprises at least 1.5 weight % and up to and including 15 weight % of a glycol and poly-glycol mono-ether co-solvent having a molecular weight of less than 150, the amount being based on the total weight of the flexographic developer concentrate.

15. The method of claim 14, wherein:
a) the fatty acid composition consists essentially of oleic acid or an alkali metal salt thereof in an amount of at least 90 weight % and up to and including 100 weight % of the fatty acid composition, and the fatty acid composition is present in an amount of equal to or less than 25 weight %;
b) ethylenediamine tetracarboxylic acid or an alkali metal salt thereof is present as the one or more aminopolycarboxylic acids or alkali metal salts thereof in an amount of at least 1.5 weight % and up to and including 10 weight %; and
c) a carbonate is present as the buffer compound in an amount of at least 4 weight % and up to and including 8 weight %;
all amounts being based on the total weight of the flexographic developer concentrate.

16. The method of claim 9, further comprising:
replenishing the flexographic developer concentrate with a replenisher developer concentrate having the same or a greater concentration of one or more of components a) through c).

17. A method for providing a flexographic printing member, comprising:
imagewise exposing a flexographic printing member precursor to provide a latent relief image in an imagewise exposed flexographic printing member precursor,
providing a flexographic developer concentrate,
forming an aqueous flexographic developer either by dissolving the flexographic developer concentrate, if in solid form, in water, or by diluting the flexographic developer concentrate, if in liquid form, by mixing 1 part of the flexographic developer concentrate with at least 2 parts and up to and including 99.8 parts of water; and
developing the imagewise exposed flexographic printing member precursor with the aqueous flexographic developer, to provide a relief image in a flexographic printing member,
wherein the flexographic developer concentrate comprises:
a) a fatty acid composition consisting of one or more saturated or unsaturated fatty acids or alkali metal salts thereof, each saturated or unsaturated fatty acid or alkali metal salt thereof independently having 12 to 20 carbon atoms, the fatty acid composition being present in an amount of at least 10 weight % and up to and including 60 weight %;
wherein at least 85 weight % and up to and including 95 weight % of the fatty acid composition is composed of one or more $C_{18}$ mono- or poly-unsaturated fatty acids or alkali metal salts thereof;
b) one or more aminopolycarboxylic acids or alkali metal salts thereof in an amount of at least 1.5 weight % and up to and including 15 weight %; and
c) a buffer compound in an amount of at least 3.5 weight % and up to and including 25 weight %;
all amounts being based on the total weight of the flexographic developer concentrate.

18. The method of claim 17, wherein the flexographic developer concentrate is provided in liquid form, and further comprises:
d) water in an amount of up to and including 85 weight %, based on the total weight of the flexographic developer concentrate.

* * * * *